ns Patent [19]

[11] 4,283,643
[45] Aug. 11, 1981

[54] HALL SENSING APPARATUS
[75] Inventor: Harry P. Levin, N. Hollywood, Calif.
[73] Assignee: Electric Power Research Institute, Inc., Palo Alto, Calif.
[21] Appl. No.: 42,645
[22] Filed: May 25, 1979
[51] Int. Cl.³ .................. G01R 33/00; H03K 17/04
[52] U.S. Cl. .................. 307/309; 307/310; 324/117 H; 323/368
[58] Field of Search .................. 307/309; 324/117 H, 324/251; 330/6; 323/94 H; 325/200

[56] References Cited

U.S. PATENT DOCUMENTS

| 2,464,807 | 3/1949 | Hansen, Jr. | 303/94 H |
|---|---|---|---|
| 3,050,698 | 8/1962 | Brass | 307/309 |
| 3,189,762 | 6/1965 | Galpin | 307/309 |
| 3,219,909 | 11/1965 | Foster | 323/94 H |
| 3,257,628 | 6/1966 | Kaenel | 307/309 |
| 3,284,703 | 11/1966 | Brunel | 324/45 H |
| 3,304,530 | 2/1967 | Honig | 307/309 |
| 3,323,056 | 5/1967 | Haley | 324/117 H |
| 3,323,057 | 5/1967 | Haley | 324/117 H |
| 3,335,383 | 8/1967 | Jordan | 307/309 |
| 3,439,270 | 5/1969 | Rehm | 323/94 H |
| 3,448,371 | 6/1969 | Boymel | 323/4 |
| 3,573,616 | 5/1971 | Kahen | 324/117 H |
| 3,693,085 | 9/1972 | Beard | 324/117 H |
| 3,814,956 | 6/1974 | Masuda et al. | 307/309 |
| 3,825,777 | 7/1974 | Braun | 307/309 |
| 3,835,373 | 9/1974 | Matula | 338/32 H |
| 3,885,212 | 5/1975 | Herbert | 324/117 H |
| 3,906,641 | 9/1975 | Freeman | 324/45 |
| 3,949,290 | 5/1976 | Ochiai et al. | 323/94H |
| 3,988,710 | 10/1976 | Sidor et al. | 307/309 |
| 4,020,294 | 5/1977 | Kitajewski et al. | 324/117 H |

Primary Examiner—Stanley D. Miller, Jr.
Assistant Examiner—B. P. Davis
Attorney, Agent, or Firm—Nilsson, Robbins, Dalgarn, Berliner, Carson & Wurst

[57] ABSTRACT

A Hall sensing apparatus having a large dynamic range is adapted for generating a current signal substantially in phase with the current in a conductor. The Hall sensing apparatus has a magnetic field concentrator assembly with oppositely disposed pick-up plates, each with a centrally attached concentrator rod for being symmetrically positioned on either side of the conductor. A Hall sensor element is wholly positioned in the space between the ends of the rods remote from the plates. A current circuit, having an externally controlled current varying device and temperature drift control device in series with a current source, provides a Hall current through the sensor element. A detection circuit, coupled across the width of the sensor element, provides an inverted and non-inverted signal in phase with the conductor current which are coupled to the inverting input of a summing amplifier. A reference voltage is then coupled to the non-inverting input of the summing amplifier to generate a dc bias offset control signal which is coupled, in a negative feedback configuration, to control the Hall current and thereby decrease the dc offset bias.

9 Claims, 3 Drawing Figures

HALL SENSING APPARATUS

BACKGROUND OF THE INVENTION

The present invention relates to a Hall sensing apparatus useful for generating a current signal having a fixed phase relationship to the current in a power distribution conductor and, more particularly, to a Hall sensing apparatus having a large dynamic range, offset dc bias control and temperature drift control.

Hall effect sensor devices which take advantage of the Hall effect are well known. In such devices, Hall current in a Hall element is deflected by a magnetic field at right angles to both the direction of Hall current and the direction of the applied magnetic field. The Hall current deflection results in a Hall output voltage across the Hall element which is proportional to the vector cross product of the Hall current and the perpendicular magnetic flux.

Numerous devices, such as field detectors, modulators and various transducers, incorporate Hall sensor elements. The present invention incorporates a Hall sensor element to detect the phase of a current in a power distribution system conductor. Such a device is useful in the phase angle meter instrument disclosed in my co-pending application Ser. No. 042,671 filed on July 2, 1979, in which a current signal having a fixed phase relationship with the conductor current is combined with a voltage signal having a fixed phase relationship with the voltage between a pair of power distribution conductors, to allow the phase angle and power factor to be readily determined.

In general, the potential gradient across the Hall element is porportional to the applied magnetic field and the Hall current. However, when the Hall element is used to generate a signal in phase with a distribution system conductor current of only several amps, it is difficult to extract the potential gradient signal from the inherently large noise on the distribution conductor. Furthermore, when the distribution system conductor current is relatively large, the potential gradient across the Hall device can exceed the power supply voltage of the signal processing circuitry resulting in serious inaccuracies and even circuit component damage. Hence, it is desired to increase the signal-to-noise ratio of the potential gradient signal when relatively low conductor currents exist and to limit the potential gradient signal when relatively high conductor current exist to thereby provide a Hall sensor device with a large dynamic range (about 5 to 800 amps).

Another major drawback of utilizing a Hall sensor element in the aforementioned application is that a dc offset voltage will generally be present. This dc offset significantly effects the determination of a positive and negative going zero voltages crossings of the potential gradient signal and, hence, the generation of a current signal in phase with the distribution conductor current. Hence, it is desired to provide for detection and compensation of any dc offset voltage which may exist.

Finally, it is well known that Hall effect devices are generally sensitive to temperature resulting in temperature drift. This adversely affects the relative phase of the potential gradient signal. In order to minimize this problem, it is desired to minimize the heating of the Hall sensor element due to the flow of Hall current.

The present invention provides a large dynamic range by incorporating a novel magnetic field concentrator assembly having two magnetic field pick-up plates for being positioned on either side and adjacent to the distribution system conductor. A concentrator rod is attached to a center region of each pick-up plate in a generally symmetrical arrangement about the periphery of the conductor 12. The ends of the concentrator rods remote from the pick-up plates are juxtaposed opposite one another with a Hall sensor element positioned in a space therebetween. A magnetic field is thus impressed across the surface of the Hall sensor element between the juxtaposed surfaces of the concentrator rods.

When there is a relatively low current, e.g., about 5 amps, in the distribution conductor, the pick-up plates operate to pick-up additional magnetic field flux and concentrate that flux in the concentrator rods. Since the inherent noise of the distribution system is generally independent of the magnetic field impressed across the Hall sensor element, the pick-up plates result in an increase in the magnitude of the potential gradient signal of the Hall sensor element without affecting the noise. Hence, the signal-to-noise ratio is increased permitting signal amplification and filtering utilizing conventional components.

As previously indicated, a relatively high current on the distribution conductor produces an output voltage signal which is frequently higher than the voltage of the power supplied to the electrically coupled amplifier and filter circuitry. However, it is known that there is an upper limit to the amount of magnetic flux which can be concentrated in a given area. Hence, the magnetic field flux across the Hall sensor element between the ends of the concentrator rods can be limited by limiting the cross-sectional area of the concentrator rods.

In the preferred embodiment, concentrator rods having a diameter of 3/16 inches were found to saturate and, hence, limit the magnitude of potential gradient across the Hall sensor element to a value less than the power supply voltage of the amplifier and filter circuitry.

In order to provide a signal with a zero volt dc bias, a dual differential amplifier network is coupled across the Hall sensor voltage outputs to generate an inverted and a non-inverted signal. These two signals are summed and compared against a reference voltage, such as ground, in a summing amplifier to generate a dc output signal which is coupled to control the amount of Hall current in the Hall sensor element. The resistors in the Hall current circuit, including the resistance of the Hall device itself, form a voltage divider. A summing amplifier controls the magnitude of the Hall current and, by using feedback control, adjusts the voltage divider such that a zero voltage bias appears on the Hall voltage terminals of the Hall voltage sensor device.

Finally, in order to minimize temperature drift in accordance with the present invention, a second current control device is provided in the Hall current circuit so that Hall current exists in the Hall element only at preselected periods of time. The current control device is activated and deactivated in response to command signals. This limits errors due to temperature drift by limiting the time during which Hall current flows in the Hall sensor element.

SUMMARY OF THE INVENTION

The present invention comprises a Hall sensing apparatus for sensing the current in a conductor. Specifically, the Hall sensing apparatus is responsive to the induced circumferential magnetic field from the current in a conductor and comprises a magnetic field concentrator means; a Hall sensor element positioned in a gap between concentrator rods in the magnetic field concentrator means, a Hall current circuit for providing a Hall current; and a Hall voltage amplifier for detecting the Hall voltage output of the Hall sensor element in response to the circumferential magnetic field.

The magnetic field concentrator means comprises first and second concentrator rods symmetrically positioned adjacent to the conductor in the plane of the magnetic field. Each of the rods has a first end and a second end, with the first ends juxtaposed opposite one another with a gap therebetween. The magnetic field concentrator means also comprises first and second pick-up plates, each attached to the second end of one of the concentrator rods, with the major plane of the pick-up plates adapted for being positioned parallel to the axis of the conductor for picking-up the magnetic field flux surrounding the conductor. The Hall sensor element is positioned in the gap between the concentrator rods in spaced relationship thereto, with the current and potential coordinates of the Hall sensor element being perpendicular to the magnetic field for generating a potential gradient across the voltage outputs of the Hall sensor element.

In the preferred embodiment, the Hall detection circuit comprises a negative feedback Hall current control circuit which comprises means for generating a non-inverted and an inverted signal representative of the Hall voltage output of the Hall sensor element and means for summing the inverted and non-inverted signals for obtaining a dc bias offset signal. Means are next provided for comparing the dc bias offset signal against a reference voltage and generating a control signal therefrom. The control signal is then coupled to a current control means which is interconnected in the Hall current circuit for varying the Hall current in response to the control signal.

Finally, the Hall sensing apparatus may also comprise a temperature drift control for intermittently generating a drift control signal which is coupled to a means for intermittently interrupting the Hall current in response to the drift control signal to thereby minimize temperature drift in the Hall sensor element.

BRIEF DESCRIPTION OF THE DRAWINGS

A complete understanding of the present invention and of the above and other objects and advantages may be gained from a consideration of the following description of the preferred embodiments taken in conjunction with the accompanying drawings in which.

DETAILED DESCRIPTION

Figure 3:
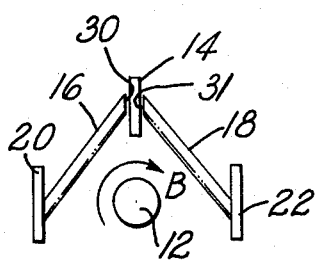
FIG. 3 is a simplified end view of the Hall sensing apparatus of FIG. 1.
Figure 1:
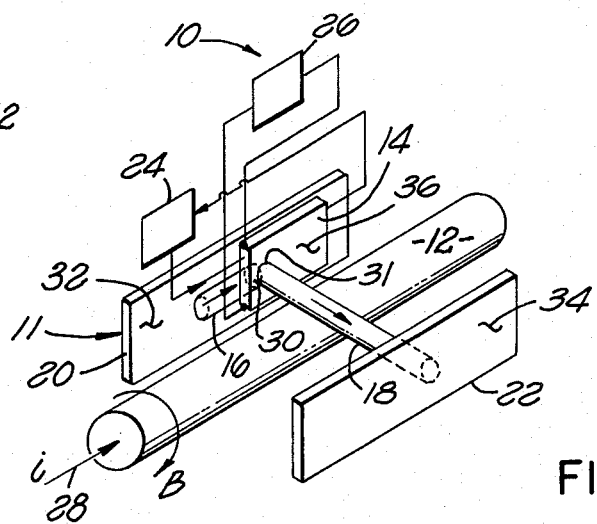
FIG. 1 is a pictorial schematic of the Hall sensing apparatus in accordance with the present invention.
Figure 2:
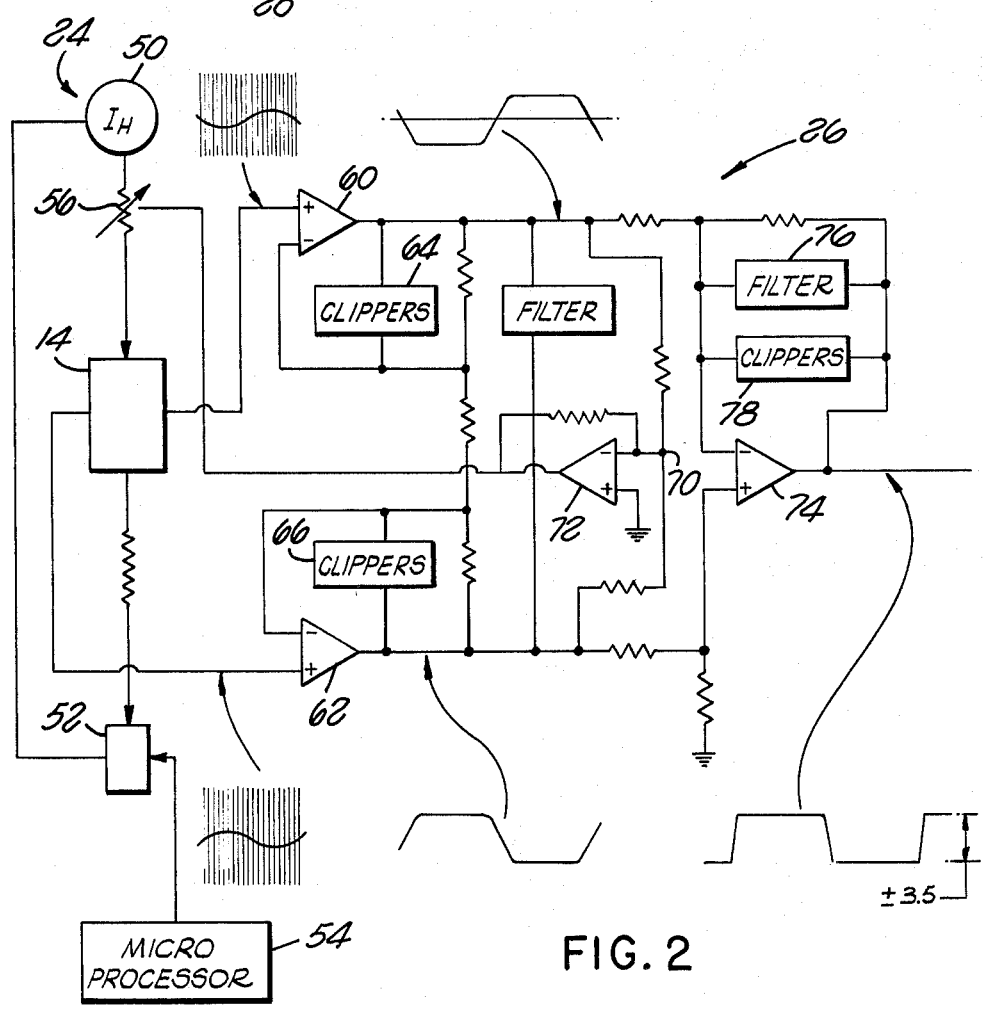
FIG. 2 is a more detailed circuit schematic illustrative of the Hall current circuit and the Hall detection circuit of FIG. 1.

Referring to FIGS. 1, 2 and 3, a Hall sensing apparatus 10 has a magnetic field concentrator assembly 11 with a pair of concentrator rods 16 and 18 for being symmetrically positioned about a distribution system conductor 12. A Hall sensor element 14 is positioned in the concentrated magnetic field between the concentrator rods 16 and 18. A Hall current circuit 24 is coupled between the terminals of the Hall sensor element 14 in series with its current coordinate and a Hall detection circuit 26 is coupled across the Hall voltage outputs of the Hall sensor element 14. The Hall detection circuit generates a signal $V_H$ in response to a voltage gradient across the Hall sensor element caused by the circumferential magnetic field induced by the distribution conductor current, i, in the conductor 12.

Referring more particularly to FIG. 1 and 2, the magnetic field concentration assembly 11 comprises the first magnetic concentrator rod 16 and the second magnetic concentrator rod 18 which are positioned in the plane of the magnetic field B about the conductor 12. The concentrator rods 16 and 18 may either be straight, as illustrated in FIG. 1 and 2, or may have any other shape which facilitates the concentration of the magnetic field about the conductor 12. The concentrator rods 16 and 18 are preferably made of a low reluctance material, such as soft iron.

In the preferred embodiment, the end surfaces 30 and 31 of the concentrator rods 16 and 18, respectively, are juxtaposed opposite one another in a spaced apart orientation. The Hall sensor element 14, which has a major planar surface 36, is then positioned between the end surfaces 30 and 31 of the concentrator rods 16 and 18. In the preferred embodiment, the entire planar surface 36 is positioned between the ends of the rods so that a uniform magnetic field flux B is impressed across the surface 36 of the Hall sensor element 14.

Pick-up plates 20 and 22 are next attached to the ends of the concentrator rods 16 and 18 remote from the surfaces 30 and 31, respectively. In the preferred embodiment, the pick-up plates 20 and 22 are rectangular with their maximum length dimension parallel to the conductor current axis 28. In addition, the major planar surfaces 32 and 34 of the pick-up plates 20 and 22, respectively, are parallel to one another and at an equal distance from, and on either side of, the conductor 12. The width of the plates, and their position relative to the conductor axis 28 is such that the magnetic field circumferential to conductors of different sizes, will still be substantially picked-up by the plates.

In operation, it is desired, as previously indicated, to provide a Hall sensing apparatus which will generate a predetermined minimum and maximum Hall voltage output signal over a large range of conductor current values, i.e., a sensing apparatus with a large dynamic range. However, the resultant output signal is only required to have a fixed phase relationship with the conductor current and need not indicate the magnitude of the conductor current i. The previously-described magnetic field concentrator assembly provides such a phase sensing capability over a large dynamic range (5 to 800 amps). Thus, when the current i flowing on the conductor 12 is at a relatively low value, the pick-up plates provide additional magnetic field concentrating capability so that the magnetic field across the Hall sensor element 14 between the end surfaces 30 and 31 of the concentrator 16 and 18 is sufficiently large so that the Hall detection circuit 26 will generate a current signal having a sufficient signal-to-noise ratio.

On the other hand, the rods 16 and 18 saturate to limit the flux of the magnetic field induced by the current i in the conductor 12 between the juxtaposed ends 30 and 31 of the rods 16 and 18. Thus, at relatively small currents in the conductor 12, the pick-up plates 20 and 22 provide an amplified magnetic field across the Hall sensor element 14 and at relatively large currents, the concentrator rods 16 and 18 saturate thereby limiting the magnitude of the magnetic field across the sensor element. The dynamic range of the Hall sensing apparatus is thereby greatly increased for purposes of generating a current signal having a fixed phase relationship to the conductor current.

Referring now specifically to FIG. 2, the circuits interconnected to the Hall sensor element 14 include the Hall current circuit 24 and the Hall detection circuit 26. Specifically, the Hall current circuit 24 comprises a Hall current source 50 which supplies a Hall current $I_H$ along the current coordinate of the Hall sensor element 14 in the conventional manner to produce a first Hall voltage $V_{H-}$ on one side of the Hall sensor element 14 and a second Hall voltage $V_{H+}$ on the other wise of the Hall sensor element 14. $V_{H-}$ and $V_{H+}$ will be equal but not necessarily zero in the absence of a perpendicular magnetic field across the surface of the Hall sensor element 14, as previously described. However, in the presence of the magnetic field, a potential gradient across the Hall sensor element 14 will occur from which the desired Hall voltage output signal may be derived.

In addition to the Hall current source 50, the Hall current circuit 24 also includes an externally controlled current varying device such as a transistor and a temperature drift control device 52 which are coupled in series with the Hall current source 50.

In operation, the current varying device 56 can be externally controlled to vary the dc offset in the Hall voltage output signal.

The temperature drift control device 52 in the Hall current circuitry 24 may be a switch device which is externally controlled by a microprocessor 54. The microprocessor is preferably programmed to activate the temperature drift control device 52 only during those periods of time when an output signal from the Hall detection circuit is desired. This feature allows substantial energy savings in the phase angle meter instrument since, in the normal operating mode, the current signal is required for only a small portion of the time.

However, more important than the energy savings realized by only intermittently enabling the current in the Hall circuit, is the minimization of Hall sensor element heating due to the Hall current. This heating causes temperature drift and consequent operating inaccuracies. Thus, substantially increased accuracy in the current signal results because the heating of the Hall sensor element 14 and hence temperature drift is minimized.

The Hall detection circuit 26 comprises a first amplifier 60 whose non-inverting input is coupled to one side of the Hall sensor element 14 and a second amplifier 62 whose non-inverting input is coupled to the other side of the Hall sensor element 14. Clippers 64 and 66 and filter 68 are coupled to the outputs of the amplifiers 60 and 62 in a conventional manner to amplify, filter and clip the signals $V_{H+}$ and $V_{H-}$.

It will be appreciated, of course, that commercially available Hall sensor elements 14 in the presence of the alternating magnetic field about the distribution conductor produce substantially in-phase sine wave signals which are buried in high frequency noise as illustrated by the waveforms in FIG. 2. The clipping, filtering and amplification which occurs utilizing the differential amplifiers 60 and 62 and the clippers 64 and 66 and filter 68 produce a substantially noise free, clipped sine wave signal as shown at the output of the amplifiers 60 and 62. In addition, it will be appreciated that the signals $V_{H+}$ and $V_{H-}$ are 180° out of phase.

Hence, to produce the desired current signal, the output of the amplifier 60 is coupled to the inverting input of an amplifier 74 and the output of the amplifier 62 is coupled to the non-inverting input of the amplifier 74 in a conventional manner. Additional filters and clippers are coupled between the inverting input and the output of the amplifier 74 to provide increased filtering and clipping. The desired current signal, which is a clipped sine wave, as illustrated in FIG. 2, is thereby generated.

In accordance with the invention, dc bias offset compensation is provided by coupling the output of amplifiers 60 and 62 at a summing junction 70 which is coupled to the inverting input of a summing amplifier 72. The non-inverting input of the amplifier 72 is then coupled to ground or some other reference voltage to produce an output signal which is a dc voltage level proportional to the difference between the reference voltage and the dc voltage produced when the inverted and non-inverted signals at the output of the amplifiers 60 and 62 are summed.

The output from the summing amplifier 72 is coupled to a control signal input of the current control device 56 to thereby vary the amount of current flowing in the Hall current circuit 24 and decrease the offset bias in the output signals from amplifiers 60 and 62. Of course, it will be appreciated that appropriate biasing resistors and inverters mah be incorporated between the output of summing amplifier 72 and the control input of the current control device 56 to assure proper functioning of the control loop.

While the present invention has been particularly shown and described with reference to preferred embodiments, it will be appreciated by those skilled in the art that the foregoing and other changes in form and detail may be made without departing from the spirit and scope of the invention.

What is claimed is:

1. A Hall sensing apparatus for sensing the current in a conductor, the apparatus being responsive to the induced circumferential magnetic field in a magnetic field plane perpendicular to the axis of the conductor, comprising:

magnetic field concentrator means comprising:
        first and second concentrator rods for being symmetrically positioned adjacent to the conductor in the magnetic field plane, each of the rods having a first end and a second end, the first ends positioned opposite one another with a gap therebetween, and
        first and second pick-up plates, each attached to the second end of one of the concentrator rods and having its major plane for being positioned parallel to the axis of the conductor for picking up magnetic field flux along the conductor;
    a Hall sensor element positioned in the gap between the concentrator rods in spaced relationship thereto, having a voltage coordinate positioned perpendicular to the magnetic field plane for generating a Hall voltage output across the voltage coordinate;
    a Hall current circuit for providing a Hall current along the current coordinate of the Hall sensor element; and
    a Hall detection circuit for detecting the Hall voltage output induced by the magnetic field and the Hall current.

2. The Hall sensing apparatus of claim 1 wherein the Hall detection circuit comprises a negative feedback Hall current control circuit comprising:

means interconnected across the Hall sensor element along the voltage coordinate for generating a non-inverted and an inverted signal representative of the potential gradient across the Hall sensor element along the voltage coordinate;

means for summing the inverted and non-inverted signals for obtaining a DC bias offset signal;

means for comparing the DC bias offset signal against a reference voltage and generating a second control signal therefrom; and current control means interconnected in the Hall current circuit for varying the Hall current in response to the second control signal.

3. The Hall sensing apparatus of claims 1 or 2 further comprising:

means for intermittently generating a first control signal; and means coupled to the first control signal means for intermittently interrupting the Hall current in response to the first control signal for decreasing temperature drift in the Hall sensor element.

4. A Hall sensing apparatus for sensing the current in a conductor, the apparatus being responsive to the induced circumferential magnetic field in a magnetic field plane perpendicular to the axis of the conductor, comprising:

a Hall sensor element for having a voltage coordinate positioned perpendicular to the magnet field plane for generating a Hall voltage output across the voltage coordinate;

a Hall current circuit for providing a Hall current along the current coordinate of the Hall sensor element; and a negative feedback Hall current control circuit comprising:

means interconnected across the voltage coordinate of the Hall sensor element for generating a non-inverted and an inverted signal representative of the potential gradient across the Hall sensor element along the voltage coordinate, means for summing the inverted and non-inverted signals for obtaining a DC bias offset signal, means for comparing the DC bias offset signal against a reference voltage and generating a second control signal therefrom, and current control means interconnected in the Hall current circuit for varying the Hall current in response to the second control signal.

5. The Hall sensing apparatus of claim 4 further comprising:

magnetic field concentrator means comprising:

first and second concentrator rods for being symmetrically positioned adjacent to the conductor in the magnetic field plane, each of the rods have a first and a second end, the first ends positioned opposite one another with a gap for receiving the Hall sensor element in spaced relationship therebetween; and first and second pick-up plates, each attached to the second end of one of the concentrator rod and having its major plane for being positioned parallel to the axis of the conductor for picking up magnetic field flux along the conductor.

6. The Hall sensing apparatus of claim 4 further comprising:

means for intermittently generating a first control signal; and means coupled to the first control signal means for intermittently interrupting the Hall current in response to the first control signal for decreasing temperature drift in the Hall sensor element.

7. A Hall sensing apparatus for sensing the current in a conductor, the apparatus being responsive to the induced circumferential magnetic field in a magnetic field plane perpendicular to the axis of the conductor, comprising:

a Hall sensor element for having a voltage coordinate positioned perpendicular to the magnetic field plane for generating a Hall voltage output across its voltage coordinate;

means for intermittently generating a first control signal;

means coupled to the first control signal means for intermittently interrupting the Hall current in response to the first control signal for decreasing temperature drift in the Hall sensor element; and a Hall current circuit interconnected for providing a Hall current along the current coordinate of the Hall sensor element;

a Hall detection circuit for detecting the Hall voltage output induced by the magnetic field and the Hall current.

8. The Hall sensing apparatus of claim 7 further comprising:

magnetic field concentrator means comprising:

first and second concentrator rods for being symmetrically positioned adjacent to the conductor in the magnetic field plane, each of the rods having a first and a second end, the first ends positioned opposite one another with a gap for receiving the Hall sensor element in spaced relationship therebetween; and first and second pick-up plates, each attached to the second end of one of the concentrator rods and having its major plane for being positioned parallel to the axis of the conductor for picking up magnetic field flux along the conductor.

9. The Hall sensing apparatus of claim 7 wherein the Hall detection circuit further comprises a negative feedback Hall current control circuit comprising:

means interconnected across the Hall sensor element along the voltage coordinate for generating a non-inverted and an inverted signal representative of the potential gradient across the Hall sensor element along the voltage coordinate;

means for summing the inverted and non-inverted signals for obtaining a DC bias offset signal;

means for comparing the DC bias offset signal against a reference voltage and generating a second control signal therefrom; and current control means interconnected in the Hall current circuit for varying the Hall current in response to the second control signal.

* * * * *